United States Patent
Nomura et al.

(10) Patent No.: US 8,791,019 B2
(45) Date of Patent: Jul. 29, 2014

(54) METAL POLISHING SLURRY AND METHOD OF POLISHING A FILM TO BE POLISHED

(75) Inventors: Yutaka Nomura, Hitachi (JP); Hiroshi Nakagawa, Hitachi (JP); Sou Anzai, Hitachi (JP); Ayako Tobita, Hitachi (JP); Takafumi Sakurada, Hitachi (JP); Katsumi Mabuchi, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 1414 days.

(21) Appl. No.: 12/159,419

(22) PCT Filed: Dec. 27, 2006

(86) PCT No.: PCT/JP2006/326106
§ 371 (c)(1),
(2), (4) Date: Mar. 8, 2010

(87) PCT Pub. No.: WO2007/077886
PCT Pub. Date: Jul. 12, 2007

(65) Prior Publication Data
US 2010/0178765 A1    Jul. 15, 2010

(30) Foreign Application Priority Data
Dec. 27, 2005  (JP) ................ P2005-374753

(51) Int. Cl.
*H01L 21/306* (2006.01)
*C11D 11/00* (2006.01)
*H01L 21/321* (2006.01)
*C09G 1/02* (2006.01)

(52) U.S. Cl.
CPC ......... *C11D 11/0047* (2013.01); *H01L 21/3212* (2013.01); *C09G 1/02* (2013.01)
USPC .......................................... 438/693; 510/175

(58) Field of Classification Search
CPC ... C11D 11/0047; H01L 21/3212; C09G 1/02
USPC .......................................... 510/175; 438/693
See application file for complete search history.

(56) References Cited

U.S. PATENT DOCUMENTS 4,944,836 A    7/1990  Beyer et al.
6,562,719 B2 * 5/2003  Kondo et al. ................ 438/691
(Continued)

FOREIGN PATENT DOCUMENTS

JP    02-278822    11/1990
JP    08-083780     3/1996
(Continued)

OTHER PUBLICATIONS

Kaufman et al., "Chemical-Mechanical Polishing for Fabricating Patterned W Metal Features as Chip Interconnects", Journal of Electrochemical Society, vol. 138, No. 11, pp. 3460 to 3464 (Nov. 1991).

(Continued)

*Primary Examiner* — Gregory Webb
(74) *Attorney, Agent, or Firm* — Antonelli, Terry, Stout & Kraus, LLP.

(57) ABSTRACT

The present invention provides a metal polishing liquid capable of CMP at a high Cu polishing rate and solving the problems: (a) generation of scratches attributable to solid particles, (b) generation of deteriorations in flatness such as dishing and erosion, (c) complexity in a washing process for removing abrasive particles remaining on the surface of a substrate after polishing, and (d) higher costs attributable to the cost of a solid abrasive itself and to waste liquid treatment, as well as a method of polishing a film to be polished by using the same. Disclosed are a metal polishing liquid which comprises a metal oxidizer, a metal oxide solubilizer, a metal anticorrosive, and a water-soluble polymer having an anionic functional group with a weight-average molecular weight of 8,000 or more and has pH 1 or more to 3 or less, and a method of polishing a film to be polished, which comprises supplying the above metal polishing liquid onto a polishing cloth of a polishing platen and simultaneously relatively moving the polishing platen and a substrate having a metallic film to be polished while the substrate is pressed against the polishing cloth.

19 Claims, 1 Drawing Sheet

(56) References Cited

U.S. PATENT DOCUMENTS

| | | | |
|---|---|---|---|
| 6,750,128 B2* | 6/2004 | Kondo et al. | 438/591 |
| 6,902,590 B2 | 6/2005 | Weinstein et al. | |
| 7,232,529 B1* | 6/2007 | Uchida et al. | 252/79.1 |
| 7,250,369 B1* | 7/2007 | Uchida et al. | 438/692 |
| 7,367,870 B2* | 5/2008 | Kurata et al. | 451/36 |
| 7,906,038 B2* | 3/2011 | Kato | 252/79.1 |
| 2002/0016073 A1* | 2/2002 | Kondo et al. | 438/691 |
| 2003/0032371 A1 | 2/2003 | Weinstein et al. | |
| 2003/0186497 A1* | 10/2003 | Kondo et al. | 438/200 |
| 2004/0171264 A1* | 9/2004 | Kondo et al. | 438/691 |
| 2005/0104048 A1 | 5/2005 | Thomas et al. | |
| 2005/0136671 A1 | 6/2005 | Goldberg et al. | |
| 2005/0181609 A1* | 8/2005 | Kurata et al. | 438/689 |
| 2006/0186373 A1* | 8/2006 | Uchida et al. | 252/79.1 |
| 2006/0216939 A1* | 9/2006 | Uchida et al. | 438/692 |
| 2007/0069176 A1* | 3/2007 | Kato | 252/79.1 |
| 2007/0167017 A1* | 7/2007 | Uchida et al. | 438/692 |
| 2007/0190906 A1* | 8/2007 | Uchida et al. | 451/36 |
| 2007/0295934 A1* | 12/2007 | Kurata et al. | 252/79.1 |
| 2008/0003924 A1* | 1/2008 | Kurata et al. | 451/36 |
| 2008/0121840 A1* | 5/2008 | Uchida et al. | 252/79.1 |

FOREIGN PATENT DOCUMENTS

| | | |
|---|---|---|
| JP | 2001-127019 | 5/2001 |
| JP | 2002-050595 | 2/2002 |
| JP | 3371775 | 11/2002 |
| JP | 2004-311565 | 11/2004 |
| JP | 2005-502188 | 1/2005 |
| JP | 2005-191544 | 7/2005 |
| JP | 2005-217396 | 8/2005 |
| JP | 2006-287207 | 10/2006 |
| WO | WO 03/094216 A1 | 11/2003 |

OTHER PUBLICATIONS

Notification of Submission of Written Opinion, Patent Application No. 10-2008-7014873, May 27, 2010, 4 pages, Korean Intellectual Property Office, Republic of South Korea.

Chinese Official Action issued Nov. 13, 2009, for Application No. 2006800494170.

Communication mailed Sep. 21, 2012, for Korean Patent Application No. 10-2011-7006918, 4 pages, Korean Intellectual Property Office, Republic of Korea.

Official Action dated Dec. 28, 2010; Patent Application No. 10-2008-7014873; 3 pages; Korean Patent Office; Republic of Korea (South Korea).

Official Action dated Oct. 13, 2010; Application No. 095449210; 5 pages; Taiwanese Patent Office.

Official Action dated Apr. 12, 2011, Japanese Patent Application No. 2007-552965; 2 pages; Japanese Patent Office; Japan.

Official Action dated Oct. 4, 2011, for Japanese Patent Application No. 2007-552965; 1 page; Japanese Patent Office; Japan.

Official Action dated Oct. 4, 2011, for Japanese Patent Application No. 2007-552965; 2 pages; Japanese Patent Office; Japan.

Official Action dated Jul. 5, 2011, for Japanese Patent Application No. 2007-552965; 2 pages; Japanese Patent Office; Japan.

* cited by examiner

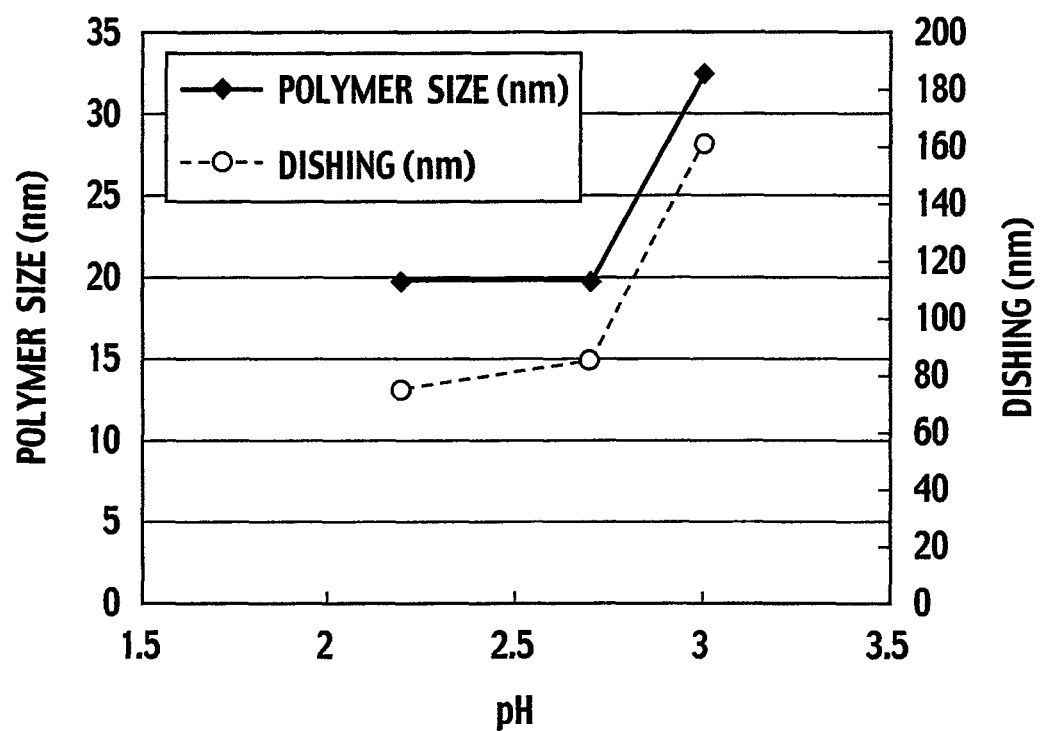

METAL POLISHING SLURRY AND METHOD OF POLISHING A FILM TO BE POLISHED

TECHNICAL FIELD

The present invention relates to a metal polishing liquid and a method of polishing a film to be polished.

BACKGROUND ART

In the development for higher integration and higher performance of a semiconductor integrated circuit (referred hereinafter to as LSI), new fine processing techniques have been developed. Chemical mechanical polishing (hereinafter, referred to as CMP) that is one of such fine processing techniques is a technique used frequently in a process for manufacturing LSI, particularly for flattening of an interlayer insulation film, formation of a metal plug and formation of an embedded metal wiring in a process for forming a multilayer wiring, and is described in, for example, U.S. Pat. No. 4,944,836.

For higher performance of LSI, it is recently attempted to use a copper alloy as a wiring material. However, the copper alloy is hardly finely processable by dry-etching used frequently in forming a conventional aluminum alloy wiring. Accordingly, a damascene process is mainly used in which a copper-alloy thin film is deposited and embedded on an insulating film having a groove previously formed thereon and then the copper-alloy thin film on a part other than the groove is removed by CMP, thereby forming an embedded wiring, and this damascene process is disclosed in, for example, Japanese Patent Application Laid-Open No. 2-278822.

CMP for metal generally involves attaching a polishing pad onto a circular polishing platen, impregnating the surface of the polishing pad with a metal polishing liquid, pressing against the pad the side of a substrate on which a metallic film was formed, and rotating the polishing platen while applying a predetermined pressure (hereinafter referred to as polishing pressure) from the backside of the substrate so as to remove a convex portion of the metallic film by the mechanical friction between the polishing liquid and the convex portion of the metallic film.

A metal polishing liquid used in CMP comprises generally of an oxidizer and abrasive particles and contains if necessary a metal oxide solubilizer, a metal anticorrosive etc. In an estimated basic mechanism, the surface of a metallic film is first oxidized by the oxidizer, and then the resultant oxidized film is removed by the abrasive particles. The oxidized layer in a concave part of the metallic film is less likely to contact with the polishing pad and does thus not undergo abrasion with abrasive particles, while a convex part of the metallic layer is removed with the progress of CMP, to flatten the surface of the substrate (see, for example, Journal of Electrochemical Society, Vol. 138, No. 11, pp. 3460 to 3464 (1991)).

However, when a wiring is formed by embedding with CMP using a conventional metal polishing liquid containing abrasive particles, the following problems arise: (a) generation of scratches attributable to solid particles, (b) deteriorations in flatness such as a phenomenon in which only the central portion of the surface of an embedded metallic wiring is isotropically polished to form a dish-like recess (referred to hereinafter as dishing) and a phenomenon in which an interlaminar insulation film together with the wiring metal is polished to form a recess (referred to hereinafter as erosion), (c) complexity in a washing process for removing abrasive particles remaining on the surface of a substrate after polishing, and (d) higher costs attributable to the cost of a solid abrasive itself and to waste liquid treatment.

For solving deteriorations in flatness by suppressing the generation of dishing, erosion and scratches to form highly reliable LSI wirings, a method of using a metal polishing liquid comprising a metal oxide solubilizer consisting of aminoacetic acid such as glycine or amidosulfuric acid and a protective film-forming agent such as BTA (benzotriazole) has been proposed (see, for example, Japanese Patent Application laid-Open No. 8-83780). The method of solving deteriorations in flatness by the protective film-forming effect of BTA etc. can prevent generation of dishing and erosion, but the polishing rate may be undesirably significantly reduced.

On the other hand, abrasive particles adhering by CMP to a substrate are removed mainly by physical washing with a brush made of polyvinyl alcohol or by sonication. As abrasive particles adhering to a substrate are made finer, however, it becomes more difficult to exert physical strength effectively on the abrasive particles.

As a polishing liquid for a metallic film, particularly for copper or a copper-based metal, a polishing liquid substantially free of abrasive particles is disclosed in, for example, Japanese Patent No. 3371775. According to this patent, a polishing liquid comprising an oxidizer for oxidizing a metallic film to be polished, an organic acid for water-solubilizing an oxide formed by oxidization with the oxidizer, water and if necessary an anticorrosive (protective film-forming agent) is used to exert mechanical friction on the surface of a metal, whereby an embedded metal wiring can be formed. For example, a method of forming a copper wiring with a polishing liquid containing hydrogen peroxide, citric acid and benzotriazole and substantially free of abrasive particles is described therein as one example, to solve the problems (a) to (d) described above. However, this method has a problem that the polishing rate under usual polishing conditions is 80 to 150 nm/min., and even if a high polishing loading of 300 g/cm$^2$ or more is applied, the polishing rate is saturated and will not exceed 200 nm/min. To cope with this problem, a method of forming an embedded metal wiring by exerting mechanical friction on a metallic surface with a metal polishing liquid containing an oxidizing substance, phosphoric acid, an organic acid, a protective film-forming agent and water and substantially free of abrasive particles has been proposed (see Japanese Patent Application laid-Open No. 2002-50595). It is described that this method can solve the above-mentioned problems (a) to (d), can realize a higher polishing rate (700 nm/min. or more) and can process an object so as to have a shape reducing dishing and erosion to about 50 nm or less. Because this metal polishing liquid is substantially free of a polishing abrasive, erosion scarcely occurs.

On the other hand, there is no description therein of wiring width and wiring density, and according to our experiments, the dishing of a Cu wiring in a part of Cu wiring width/wiring space=100 μm/100 μm on a SEMATECH 854 pattern mask wafer polished with this polishing liquid is 100 nm or more, thus making it unusable as a metal polishing liquid for forming an embedded Cu wiring at the level in and after technology node 130 nm (hp 130). As used herein, the technology node refers to a generation of semiconductor technology and is expressed as half (half pitch) of the minimum wiring pitch of DRAM word line/bit line (see, for example, ITRS (International Technology Roadmap for Semiconductors) for 2003 published by US SEMATECH (Semiconductor Manufacturing Technology Institute).

As described above, the metal polishing liquid to which a polishing abrasive is not added or an ultratrace amount of a polishing abrasive is added can solve scratches and erosion, the necessity for removal of a polishing abrasive after polishing, a problem such as higher costs attributable to the cost of a solid abrasive itself and to waste liquid treatment and a problem in polishing rate aimed at improving throughput, but has hardly reduced dishing contributing significantly to the reliability and performance of a wiring. The conventional polishing liquid has a problem that it causes significant dishing mainly on a wide-width wiring part and cannot be used as a metal polishing liquid for forming an embedded Cu wiring at the level in and after the technology node 130 nm.

The present invention provides a metal polishing liquid capable of CMP at a high Cu polishing rate and solving the problems: (a) generation of scratches attributable to solid particles, (b) generation of deteriorations in flatness such as dishing and erosion, (c) complexity in a washing process for removing abrasive particles remaining on the surface of a substrate after polishing, and (d) higher costs attributable to the cost of a solid abrasive itself and to waste liquid treatment, that is, a metal polishing liquid capable of forming an embedded Cu wiring at the level in and after the technology node 130 nm as well as a method of polishing a film to be polished by using the same.

DISCLOSURE OF INVENTION

The present invention relates to (1) a metal polishing liquid which comprises a metal oxidizer, a metal oxide solubilizer, a metal anticorrosive, and a water-soluble polymer having an anionic functional group with a weight-average molecular weight of 8,000 or more and has pH 1 to 3.

The present invention also relates to (2) the metal polishing liquid according to the above-mentioned (1), wherein the metal oxidizer is at least one oxidizer selected from hydrogen peroxide, ammonium persulfate, nitric acid, potassium periodate, hypochlorous acid, and ozone water.

The present invention also relates to (3) the metal polishing liquid according to the above-mentioned (1) or (2), wherein the metal oxide solubilizer is at least one metal oxide solubilizer selected from inorganic or organic acids having a first-stage acid dissociation exponent of less than 3.7 at 25° C. and salts thereof.

The present invention also relates to (4) the metal polishing liquid according to any one of the above-mentioned (1) to (3), wherein the metal oxide solubilizer is at least one metal oxide solubilizer selected from malonic acid, citric acid, malic acid, glycolic acid, glutamic acid, glyconic acid, oxalic acid, tartaric acid, picolinic acid, nicotinic acid, mandelic acid, acetic acid, sulfuric acid, nitric acid, phosphoric acid, hydrochloric acid, formic acid, lactic acid, phthalic acid, fumaric acid, maleic acid, aminoacetic acid, amidosulfuric acid, or salts thereof.

The present invention also relates to (5) the metal polishing liquid according to any one of the above-mentioned (1) to (4), wherein the metal anticorrosive is at least one metal anticorrosive selected from a nitrogen-containing cyclic compound and an ionic surfactant.

The present invention also relates to (6) the metal polishing liquid according to any one of the above-mentioned (1) to (5), wherein the water-soluble polymer having an anionic functional group is a water-soluble polymer having at least one anionic functional group selected from a sulfonic acid group, a carboxylic acid group, a phosphoric acid group or a salt thereof.

The present invention also relates to (7) the metal polishing liquid according to any one of the above-mentioned (1) to (6), wherein abrasive particles are added in an amount of less than 1 wt % based on the weight of the metal polishing liquid.

The present invention also relates to (8) the metal polishing liquid according to any one of the above-mentioned (1) to (7), wherein the abrasive particles are one or more kinds of abrasive particles selected from silica, alumina, ceria, titania, zirconia and germania.

The present invention also relates to (9) the metal polishing liquid according to any one of the above-mentioned (1) to (8), wherein a metal to be polished as an object of polishing with the metal polishing liquid is at least one metal selected from copper, a copper alloy and a copper compound.

The present invention also relates to (10) a method of polishing a film to be polished, which comprises supplying the metal polishing liquid according to any one of the above-mentioned (1) to (9) onto a polishing cloth of a polishing platen and simultaneously relatively moving the polishing platen and a substrate having a metallic film to be polished while the substrate is pressed against the polishing cloth.

According to the metal polishing liquid and the method of polishing a film to be polished in the present invention, the above-mentioned problems (a) to (d) can be solved, and an embedded Cu wiring with low dishing, that is, at the level required in and after the technology node 130 nm can be formed at a high polishing rate.

BRIEF DESCRIPTION OF DRAWING

FIG. 1 is a graph plotted in the relationship between the pH of an aqueous solution wherein the water-soluble polymer having an anionic functional group is a polycarboxylic acid and the metal oxide solubilizer is sulfuric acid, and the size of the polymer, and in the relationship between the pH of a metal polishing liquid wherein the metal oxidizer is hydrogen peroxide, the metal oxide solubilizer is sulfuric acid, the metal anticorrosive is benzotriazole, and the water-soluble polymer having an anionic functional group is a polycarboxylic acid, and the dishing with the metal polishing liquid.

BEST MODE FOR CARRYING OUT THE INVENTION

Hereinafter, the metal polishing liquid of the present invention is described in detail.

Conventionally, the metal polishing liquid substantially free of a polishing abrasive has been demanded to reduce the amount of a metal anticorrosive added to the minimum in order to prevent the polishing rate from being decreased. However, when the amount of the metal anticorrosive added is reduced, isotropic etching of not only the surface of contact with a polishing cloth but also a concave part proceeds, so dishing cannot be sufficiently suppressed. Against this problem, various metal polishing liquids have been examined to achieve suppression of etching and improvement in polishing rate, but formation of an embedded Cu wiring with dishing at the level required in and after the technology node 130 nm has been difficult.

To cope with this problem, the inventors found that a metal anticorrosive, and a water-soluble polymer having an anionic functional group with a weight-average molecular weight of 8,000 or more, can be simultaneously used in a sufficiently low pH range to achieve a sufficiently high polishing rate applicable to CMP and to form an embedded Cu wiring with dishing at the level required in and after the technology node 130 nm.

The metal polishing liquid of the present invention is characterized in that it comprises a metal oxidizer, a metal oxide solubilizer, a metal anticorrosive, and a water-soluble polymer having an anionic functional group with a weight-average molecular weight of 8,000 or more and has pH 1 or more to 3 or less.

The pH of the metal polishing liquid of the present invention is 1 or more to 3 or less, preferably 1.5 or more to 2.8 or less, more preferably 1.8 or more to 2.5 or less. When the pH is higher than 3, dishing is increased, while when the pH is lower than 1, dishing considered attributable to corrosion or etching of wiring metal is increased. The pH can be regulated for example by changing the amount of the metal oxide solubilizer added to the metal polishing liquid. The pH can also be regulated by using a base such as ammonia or potassium hydroxide in combination with the metal oxide solubilizer.

The pH in the present invention can be measured with a pH meter (for example, Model pH81, manufactured by Yokogawa Electric Corporation). In measurement, the pH meter was adjusted at 2 points with standard buffers (a phthalate pH buffer, pH 4.21 (25° C.) and a neutral phosphate pH buffer, pH 6.86 (25° C.)), and then its electrode was placed in the polishing liquid, and the pH value of the polishing liquid after stabilization by leaving it for 2 minutes or more was read.

The metal oxidizer in the present invention includes hydrogen peroxide ($H_2O_2$), nitric acid, potassium periodate, ammonium persulfate, hypochlorous acid, ozone water etc., among which hydrogen peroxide is preferable. These oxidizers may be used alone or as a mixture of two or more thereof. When the substrate is a silicon substrate containing an element for integrated circuit, its contamination with alkali metals, alkaline earth metals, halides etc. is not desirable, and thus the oxidizer is preferably free of a nonvolatile component and is particularly preferably hydrogen peroxide from the viewpoint of stability.

The amount of the oxidizer compounded in the present invention is suitably selected, but is preferably 3 to 20 wt %, more preferably 5 to 15 wt %, based on the total weight of the polishing liquid. When the amount of the oxidizer compounded is lower than 3 wt %, a sufficient polishing rate tends to be not obtainable, while when the amount is higher than 20 wt %, a sufficient rate tends to be not obtainable either.

The metal oxide solubilizer in the present invention is at least one water-soluble metal oxide solubilizer selected from inorganic or organic acids having a first-stage acid dissociation exponent (pK1) of less than 3.7, more preferably from 2.0 to 3.7, and salts thereof. Such metal oxide solubilizer includes, for example, malonic acid, citric acid, malic acid, glycolic acid, glutamic acid, gluconic acid, oxalic acid, tartaric acid, picolinic acid, nicotinic acid, mandelic acid, acetic acid, sulfuric acid, nitric acid, phosphoric acid, hydrochloric acid, formic acid, lactic acid, phthalic acid, fumaric acid, maleic acid, aminoacetic acid, amidosulfuric acid, or ammonium salts thereof and potassium salts thereof. These metal oxide solubilizers are preferable from the viewpoint of easy balance with a protective layer-forming agent. Among these, malic acid, tartaric acid, citric acid, phosphoric acid and sulfuric acid are preferable, and malic acid, phosphoric acid and sulfuric acid are more preferable, from the viewpoint of maintaining a practical CMP rate while efficiently suppressing an etching rate. These metal oxide solubilizers may be used alone or as a mixture of two or more thereof.

In the present invention, the dissociation of anionic functional groups of the water-soluble polymer should be suppressed in order to achieve a higher polishing rate and lower dishing. Addition of an acid having low pK1 is effective in suppressing the dissociation of anionic functional groups, and specifically a water-soluble metal oxide solubilizer having a pK1 value of less than 3.7 was found to be useful for suppressing the dissociation of anionic functional groups of the water-soluble polymer. The acid dissociation exponent in the present invention is the logarithm of a reciprocal of the acid dissociation constant and is described in detail in, for example, "Kagaku Binran Kisohen" (Handbook of Chemistry, Basic Edition), Revised 4th edition, pp. II-317-321, published on Sep. 30, 1993 by Maruzen Co., Ltd.

The amount of the metal oxide solubilizer compounded in the present invention is suitably selected, but is preferably 0.05 to 3.0 wt %, more preferably 0.1 to 1.0 wt %, based on the total weight of the polishing liquid. When the amount of the metal oxide solubilizer compounded is lower than 0.05 wt %, a sufficient polishing rate tends to be not obtainable, while when the amount is higher than 3.0 wt %, practical flatness tends to be not obtainable.

The metal anticorrosive in the present invention is considered to form a protective film on an oxidized layer on the surface of a metallic film, thereby preventing the oxidized layer from being dissolved in the polishing liquid, and such metal anticorrosive includes ammonia; an alkylamine such as dimethylamine, trimethylamine, triethylamine, or propylenediamine, or an amine such as ethylenediaminetetraacetic acid (EDTA), sodium diethydithiocarbamate, or chitosan; an imine such as dithizone, cuproine (2,2'-biquinoline), neocuproine (2,9-dimethyl-1,10-phenanthroline), bathocuproine (2,9-dimethyl-4,7-diphenyl-1,10-phenanthroline), or cuperazone (biscyclohexanone oxalylhydrazone); an azole such as benzimidazole-2-thiol, triazine dithiol, triazine trithiol, 2-[2-(benzothiazolyl)]thiopropionic acid, 2-[2-(benzothiazolyl)] thiobutyric acid, 2-mercaptobenzothiazole, 1,2,3-triazole, 1,2,4-triazole, 3-amino-1H-1,2,4-triazole, benzotriazole, 1-hydroxybenzotriazole, 1-dihydroxypropyl benzotriazole, 2,3-dicarboxypropyl benzotriazole, 4-hydroxybenzotriazole, 4-carboxyl-1H-benzotriazole, 4-carboxyl-1H-benzotriazole methyl ester, 4-carboxyl-1H-benzotriazole butyl ester, 4-carboxyl-1H-benzotriazole octyl ester, 5-hexyl benzotriazole, N-(1,2,3-benzotriazolyl-1-methyl)-N-(1,2,4-triazolyl-1-methyl)-2-ethyl hexyl amine, tolyl triazole, naphthotriazole or bis[(1-benzotriazolyl) methyl]phosphonic acid; a mercaptan such as nonyl mercaptan or dodecyl mercaptan; and glucose, cellulose, dodecylbenzenesulfonic acid, dodecylsulfuric acid and salts thereof. Among these compounds, a nitrogen-containing cyclic compound and an ionic surfactant are suitable for satisfying both suppression of etching rate and high polishing rate, and the nitrogen-containing cyclic compound is more preferable. The ionic surfactant is preferably an ionic surfactant having one or more ionic groups selected from a sulfonic acid group, a carboxylic acid group, a phosphoric acid group and a phenolic hydroxyl group, wherein a hydrophobic group is composed of 6 or more carbon atoms. These metal anticorrosives can be used alone or as a mixture of two or more thereof.

The amount of the metal anticorrosive compounded in the present invention is suitably selected, but is preferably 0.05 to 3.0 wt %, more preferably 0.1 to 1.0 wt %, based on the total weight of the polishing liquid. When the amount of the metal anticorrosive compounded is lower than 0.05 wt %, a sufficient anticorrosive effect tends to be not obtainable, thus increasing etching and deteriorating flatness, while when the amount is higher than 3.0 wt %, a practical polishing rate tends to be not obtainable.

The weight-average molecular weight of the water-soluble polymer having an anionic functional group in the present invention is 8,000 or more, preferably 8,000 or more to 200,000 or less, more preferably 20,000 or more to 100,000 or less, even more preferably 40,000 or more to 80,000 or less.

When the weight-average molecular weight is lower than 8,000, the polishing rate is decreased and dishing is increased. The upper limit of the weight-average molecular weight is not particularly limited, but when the weight-average molecular weight is higher than 200,000 for example, a significant reduction in polishing rate is not recognized, but the polishing rate distribution in polishing-wafer plane tends to vary significantly thus increasing dishing.

The weight-average molecular weight of the water-soluble polymer having an anionic functional group in the present invention was measured by gel permeation chromatography. Measurement conditions etc. are as shown below.
Pump: L-6000 manufactured by Hitachi, Ltd.
Detector: L-3300 R1 detector manufactured by Hitachi, Ltd.
Column: Gelpack GL-W500 manufactured by Hitachi, Ltd.
Column size: 10.7 mm ($\phi$)×300 mm
Eluent: 100 mM phosphate buffer, pH 6.8/acetonitrile=90/10 (vol %)
Solution sending pressure: 17 kgf/cm$^2$
Eluent flow rate: 1.0 ml/min.
Measurement sample volume: 50 µl
Calibration curve: PEG/PEO The water-soluble polymer having an anionic functional group is a water-soluble polymer having at least one kind of anionic functional group selected from a sulfonic acid group, a carboxylic acid group, a phosphoric acid group and a salt thereof. Such anionic functional group is preferably a sulfonic acid group, a carboxylic acid group or a phosphoric acid group, more preferably a sulfonic acid group or a carboxylic acid group. The salt can be exemplified by alkali metal salts, alkaline earth metal salts, halides and ammonium salts, but when the substrate to which the polishing liquid is applied is a silicon substrate for semiconductor integrated circuit, its contamination with alkali metals, alkaline earth metals, halides etc. is not desirable, and thus ammonium salts are preferably used. The water-soluble polymer has at least one kind of such anionic functional group and may have two or more kinds thereof. Two or more kinds of water-soluble polymers different in anionic functional group may also be used.

Such water-soluble polymer having an anionic group includes polystyrenesulfonic acid, polyacrylamidomethylpropanesulfonic acid, polymalic acid, polyacrylic acid, polymethacrylic acid, polycrotonic acid, polyitaconic acid, polymaleic acid, polyfumaric acid, polyvinylsulfonic acid, polyaspartic acid, polyglutamic acid, polyphosphoric acid, polymetaphosphoric acid, and their ammonium salts, alkali metal salts and alkaline earth metal salts. Among these, polycarboxylic acid is preferably used. The polycarboxylic acid used herein refers to a water-soluble polymer having a carboxyl group as a functional group.

These water-soluble polymers having anionic functional groups can be produced by conventional methods.

In the present invention, a higher polishing rate and excellent dishing can be achieved by adding the water-soluble polymer having an anionic functional group. The amount of such water-soluble polymer compounded is suitably selected, but is preferably 0.05 to 2.0 wt %, more preferably 0.1 to 0.8 wt %, based on the total weight of the polishing liquid. When the amount of the water-soluble polymer having an anionic functional group compounded is lower than 0.05 wt %, a practical polishing rate tends to be not obtainable.

FIG. 1 shows the relationship among pH, the particle size of a water-soluble polymer having an anionic functional group, and dishing. The particle size of the water-soluble polymer having an anionic functional group was determined by measuring the water-soluble polymer having an anionic functional group after pH adjustment with a metal oxide solubilizer.

The water-soluble polymer having an anionic functional group used was a polycarboxylic acid, and the metal oxide solubilizer used was sulfuric acid.

A metal polishing liquid comprises a metal oxidizer, a metal oxide solubilizer, a metal anticorrosive, and a water-soluble polymer having an anionic functional group, and its pH was regulated with the metal oxide solubilizer.

The metal oxidizer is hydrogen peroxide; the metal oxide solubilizer is sulfuric acid; the metal anticorrosive is benzotriazole; and the water-soluble polymer having an anionic functional group is a polycarboxylic acid. The particle size of the water-soluble polymer having an anionic functional group is a value obtained with a laser diffraction particle size distribution meter and is regarded as an indicator indicative of the spread of a polymer chain in an aqueous solution. The indicated particle size is an median size. It can be seen that as the pH is lowered, the polymer size is decreased. This is considered attributable to the fact that as the pH is lowered, the dissociation of anionic functional groups is suppressed to lower electrostatic repulsion among the anionic functional groups thereby shrinking the polymer chain. It can also be seen that as the pH is lowered, dishing is suppressed.

It is estimated that the protective film formed on a metal to be polished is a layer made of a reaction product wherein an adsorption layer of the metal anticorrosive and the polymer in the metal polishing liquid, or the anticorrosive and the polymer, are bound via a coordinate bond, an ionic bond or a covalent bond to a metal to be polished or its ion.

The metal anticorrosive forms a dense and strong protective film and is thus very effective in preventing dishing, but decreases the polishing rate as its amount is increased. On the other hand, the metal polishing liquid to which the water-soluble polymer is added can prevent the polishing rate from decreasing, but decreases an effect of preventing dishing from increasing. This is considered attributable to the fact that the water-soluble polymer occurs with its chain extending in the metal polishing liquid, and a protective film formed by this polymer chain becomes a coarse protective film which in turn decreases an effect of preventing dishing from increasing.

It is estimated that the metal polishing liquid of the present invention is used in a low pH range thereby effectively covering a metal to be polished, with the water-soluble polymer having a shrunk polymer chain, that is, the dense water-soluble polymer, thus forming a dense protective film for preventing dishing from increasing. Generally, as the molecular weight of the polymer is increased, the polishing rate is increased, but the flatness of a surface to be polished tends to be hardly obtainable, while when the molecular weight of the polymer is decreased, the flatness of a surface to be polished is obtainable, but the polishing rate tends to be decreased. It is estimated that by using the water-soluble polymer having a weight-average molecular weight of 8000 or more in a specific pH range in the present invention, a polymer chain of the water-soluble polymer is shrunk to decrease the particle size of the polymer, and as a result, a higher polishing rate and the flatness of a surface to be polished can be achieved. It is also estimated that a higher polishing rate is attained by forming not a solid and strong protective film such as that of the metal anticorrosive but a dense and soft protective film. Generally, simultaneous use of the metal anticorrosive and the water-soluble polymer, as compared with single use of the metal anticorrosive, brings about formation of a softer protective film to improve the polishing rate, but the flatness of a surface to be polished cannot be obtained. In the present invention, the metal anticorrosive and the water-soluble polymer having a weight-average molecular weight of 8000 or more are used at pH set in a specific range, thereby attaining a higher polishing rate and the flatness of a surface to be polished.

(Method of Measuring the Particle Size of the Water-soluble Polymer)

The water-soluble polymer in an aqueous solution having pH adjusted with the metal oxide solubilizer used in the present invention was measured for its particle size (referred to in the Examples as median size) with a laser diffraction particle size distribution meter.

Measuring instrument: ZETASIZER 3000HS manufactured by MALVERN
Measurement conditions
Temperature: 25° C.
Refractive index of dispersion medium: 1.33
Viscosity of dispersion medium: 0.89 cP In the present invention, abrasive particles may be added to the metal polishing liquid, and by adding abrasive particles, the polishing rate can be further improved. However, dishing may be increased by adding abrasive particles, and thus the amount of the abrasive particles added is suitably selected in such a range that the effect of the present invention is not influenced. The amount of the abrasive particles added is preferably lower than 1 wt %, more preferably 0.001 to 1 wt %, still more preferably 0.03 to 1 wt %, based on the weight of the polishing liquid. When the amount of the abrasive particles added is higher than 1 wt %, dishing tends to be deteriorated. The lower limit of the amount of the abrasive particles added is not particularly limited, but when the amount is lower than 0.001 wt % for example, the abrasive particles added tend to fail to attain the desired effect without contributing to improvement in polishing rate.

The abrasive particles include inorganic abrasives such as silica, alumina, titania, ceria, zirconia, germania etc. and organic abrasives such as polystyrene, polyacryl, polyvinyl chloride etc. Among these, silica, alumina and ceria are preferable and colloidal silica and/or colloidal silica derivatives are more preferable. The abrasive particles may be used after regulation of potential by adding a trace metal species or by surface modification. The method therefor is not particularly limited. The colloidal silica derivatives used herein refer to those based on colloidal silica that have a trace amount of a metal species added in sol-gel reaction or have surface silanol groups subjected to chemical modification, and the method therefor is not particularly limited. These abrasive particles may be used alone or as a mixture of two or more thereof.

The primary particle size of the abrasive particles is suitably regulated according to the type of a metal to be polished and the type of the abrasive particles, but is preferably 200 nm or less, more preferably 5 to 200 nm, still more preferably 5 to 150 nm, further more preferably 5 to 100 nm. When the primary particle size is greater than 200 nm, the flatness of the polished surface tends to be deteriorated. When a primary particle size of less than 5 nm is selected, attention should be paid because the CMP rate may be decreased.

When the abrasive particles are aggregated, the secondary particle size is preferably 200 nm or less, more preferably 10 to 200 nm, still more preferably 10 to 150 nm, further more preferably 10 to 100 nm. When the secondary particle size is greater than 200 nm, the flatness of the polished surface tends to be deteriorated. When a secondary particle size of less than 10 nm is selected, attention should be paid because the ability of the abrasive particles to mechanically remove a reaction layer may become insufficient to decrease the CMP rate.

The primary particle size of the abrasive particles in the present invention can be determined with a transmission electron microscopy (for example, S4700 manufactured by Hitachi, Ltd.). The secondary particle size can be determined with a light diffraction particle size distribution meter (for example, COULTER N4SD manufactured by COULTER Electronics).

In addition to the components described above, additives added generally to polishing liquid, such as a coloring matter such as a dye, a pigment etc., a pH adjusting agent, and a solvent other than water may be added to the metal polishing liquid of the present invention in such a range that the working effect of the polishing liquid is not deteriorated.

The method of polishing a film to be polished according to the present invention comprises supplying the metal polishing liquid of the present invention onto a polishing cloth of a polishing platen and simultaneously relatively moving the polishing platen and a substrate having a metallic film to be polished while the substrate is pressed against the polishing cloth.

The metallic film to be polished as the subject of polishing may be a single layer or a lamination layer. The metallic film includes a film of one or more members selected from metals such as copper, aluminum, tungsten, tantalum and titanium, alloys thereof, and compounds thereof such as oxides and nitrides. Among these, copper, a copper alloy and a copper compound are preferable. The metallic film is formed by known methods such as sputtering and plating. The substrate includes substrates involved in production of semiconductor devices, such as a semiconductor substrate at the stage after formation of a circuit element and wiring pattern and a substrate having an insulating layer formed on a semiconductor substrate such as a semiconductor substrate at the stage after formation of a circuit element.

As the polishing apparatus used in the polishing method of the present invention, it is possible to use a general polishing apparatus comprising a holder for supporting a substrate having a metallic film to be polished and a polishing platen to which a polishing cloth (pad) is adhered and which is equipped with, for instance, a motor whose number of revolutions can arbitrarily be controlled. For example, MIRRA manufactured by Applied Materials can be used.

The polishing cloth on the polishing platen is not particularly limited, and for example, a general non-woven fabric, foamed polyurethane or porous fluororesin may be used. The polishing conditions are not limited, but the rotation speed of the polishing platen is preferably as low as 200 rpm or less so as to prevent a substrate from flying out.

The pressure under which a substrate having a metallic film to be polished is pressed against the polishing cloth, is preferably 5 to 100 kPa, more preferably 10 to 50 kPa, from the viewpoint of satisfying the polishing rate uniformity in the plane of a metallic film to be polished and the flatness of pattern.

For relatively moving the polishing cloth and a metallic film on a substrate to be polished while the metallic film to be polished is pressed against the polishing cloth, the substrate and/or the polishing platen may be moved. Instead of rotation of the polishing platen, the holder may be rotated or rocked to polish a metallic film. Such methods include a method of polishing by sun-and-planet rotation of a polishing platen, a method of polishing by linearly moving a belt-shaped polishing cloth longitudinally in one direction. The holder may be in any one of fixed, rotated and rocked states. The polishing method for relatively moving the polishing cloth and a metallic film to be polished can be suitably selected depending on a surface to be polished and the polishing apparatus used.

During the polishing, the metal polishing liquid is preferably continuously fed onto the polishing cloth by means of a pump, etc. The feed rate of the metal polishing liquid is not limited, but is preferably sufficient to always cover the surface of the polishing cloth with the polishing liquid. Specifically, the metal polishing liquid is fed in an amount of 0.3 to 0.9 ml per cm² of the polishing cloth.

After completion of the polishing, it is preferable that the semiconductor substrate is thoroughly cleaned with running water, and water droplets on the semiconductor substrate are removed by a spin dryer or the like and the substrate is then dried.

EXAMPLES

Hereinafter, the present invention is described in more detail by reference to the Examples. However, the present invention is not limited thereto.

Preparation of Metal Polishing Liquid

Examples 1 to 6 and Comparative Examples 1 to 2

Based on the weight of polishing liquid, 30 wt % hydrogen peroxide (special grade chemical, 30% aqueous solution), a metal oxide solubilizer shown in Table 1, 0.4 wt % benzotriazole, 0.4 wt % water-soluble polymer having an anionic functional group shown in Table 1, and the balance being purified water in an amount to adjust the total to 100 wt %, were compounded with one another to prepare polishing liquids (A) to (F) in Examples 1 to 6 and polishing liquids (I) to (J) in Comparative Examples 1 to 2. The pH of each polishing liquid was adjusted with the metal oxide solubilizer to the pH value shown in Table 1.

Examples 7 to 8 and Comparative Example 3

Based on the weight of polishing liquid, 30 wt % hydrogen peroxide (special grade chemical, 30% aqueous solution), a metal oxide solubilizer shown in Table 1, 0.4 wt % benzotriazole, 0.4 wt % water-soluble polymer having an anionic functional group shown in Table 1, 0.05 wt % colloidal silica abrasive having a median size of 60 nm, and the balance being purified water in an amount to adjust the total to 100 wt %, were compounded with one another to prepare polishing liquids (G) to (H) in Examples 7 to 8 and polishing liquid (K) in Comparative Example 3. The pH of each polishing liquid was adjusted with the metal oxide solubilizer to the pH value shown in Table 1.

Comparative Example 4

Based on the weight of polishing liquid, 30 wt % hydrogen peroxide (special grade chemical, 30% aqueous solution), a metal oxide solubilizer shown in Table 1, 0.4 wt % benzotriazole, and the balance being purified water in an amount to adjust the total to 100 wt %, were compounded with one another to prepare polishing liquid (L) in Comparative Example 4. The pH of each polishing liquid was adjusted with the metal oxide solubilizer to the pH value shown in Table 1.

Comparative Example 5

Based on the weight of polishing liquid, 30 wt % hydrogen peroxide (special grade chemical, 30% aqueous solution), a metal oxide solubilizer shown in Table 1, 0.4 wt % benzotriazole, 0.4 wt % water-soluble polymer (cationic polymer, polylysine) shown in Table 1, and the balance being purified water in an amount to adjust the total to 100 wt %, were compounded with one another to prepare polishing liquid (M) in Comparative Example 5. The pH of each polishing liquid was adjusted with the metal oxide solubilizer to the pH value shown in Table 1.

Comparative Example 6

Based on the weight of polishing liquid, 30 wt % hydrogen peroxide (special grade chemical, 30% aqueous solution), a metal oxide solubilizer shown in Table 1, 0.4 wt % benzotriazole, 0.4 wt % water-soluble polymer shown in Table 1, and the balance being purified water in an amount to adjust the total to 100 wt %, were compounded with one another to prepare polishing liquid (N) in Comparative Example 6. The pH of each polishing liquid was adjusted with the metal oxide solubilizer to the pH value shown in Table 1.

(Substrate with a Formed Copper Wiring to be Polished)

An unpatterned silicon substrate to be polished was prepared by forming a silicon dioxide insulating layer on the surface of a silicon substrate, then forming a 15-nm TaN film, 10-nm Ta film and 100-nm copper film by sputtering, and depositing 1.3-μm copper thereon by electrolytic plating.

A patterned silicon substrate to be polished was prepared by forming a silicon dioxide insulating layer on the surface of a silicon substrate, then forming a wiring groove on the silicon dioxide insulating layer with a SEMATECH 854 pattern mask, forming a 15-nm TaN film, 10-nm Ta film and 100-nm copper film by sputtering, and depositing 1.1-μm copper thereon by electrolytic plating. The depth of the wiring groove is 500 nm.

(CMP Polishing Conditions)

Polishing apparatus: MIRRA manufactured by Applied Materials

Polishing pressure: 13.8 kPa

Rate of polishing liquid fed: 200 ml/min.

(Washing after CMP)

After CMP, the specimen was washed with a brush made of polyvinyl alcohol and by sonication in water, followed by drying with a spin dryer.

(Evaluation Items of the Polished Product)

Copper polishing rate: The unpatterned silicon substrate prepared above was polished for 60 seconds under the above polishing conditions while the polishing cloth was supplied with each of the polishing liquids (A) to (N) prepared above. The difference in thickness of the copper film before and after polishing was calculated from electrical resistance values. The results are shown in Table 1.

Dishing: The patterned silicon substrate prepared above was polished while the polishing cloth was supplied with each of the polishing liquids (A) to (N) prepared above. In polishing, excess copper on the wafer was completely removed followed by over-polishing (additional polishing) for 30 seconds. The amount of the reduced film on the wiring metal part relative to the insulating film part was measured with a contact profilometer (trade name: DECKTAK V200-Si manufactured by Veeco instruments). The results are shown in Table 1.

Whether scratches had occurred on the substrate after CMP was confirmed by check with eyes, observation under a optical microscope and observationic under an electron microscope. As a result, occurrence of significant scratches was not recognized in all of the Examples and the Comparative Examples.

TABLE 1

| | | Examples | | | | | | | | Comparative Examples | | | | | |
|---|---|---|---|---|---|---|---|---|---|---|---|---|---|---|---|
| | | 1 | 2 | 3 | 4 | 5 | 6 | 7 | 8 | 1 | 2 | 3 | 4 | 5 | 6 |
| Polishing liquid | | A | B | C | D | E | F | G | H | I | J | K | L | M | N |
| Oxidizer (wt %) | Hydrogen peroxide (30% aqueous solution) | 30 | 30 | 30 | 30 | 30 | 30 | 30 | 30 | 30 | 30 | 30 | 30 | 30 | 30 |
| Metal oxide solubilizer (wt %) | | sulfuric acid | sulfuric acid | sulfuric acid | sulfuric acid | malic acid | phosphoric acid | sulfuric acid | sulfuric acid | sulfuric acid | sulfuric acid | sulfuric acid | sulfuric acid | sulfuric acid | sulfuric acid |
| Metal anticorrosive (wt %) | Benzotriazole | 0.4 | 0.4 | 0.4 | 0.4 | 0.4 | 0.4 | 0.4 | 0.4 | 0.4 | 0.4 | 0.4 | 0.4 | 0.4 | 0.4 |
| Water-soluble polymer (wt %) | Polyphosphoric acid (molecular weight: 82000) | 0.4 | 0.4 | — | — | — | — | 0.4 | — | 0.4 | — | — | — | — | — |
| | Polyacrylic acid (molecular weight: 72000) | — | — | 0.4 | 0.4 | 0.4 | 0.4 | — | 0.4 | — | 0.4 | — | — | — | — |
| | Polyacrylic acid (molecular weight: 7000) | — | — | — | — | — | — | — | — | — | — | — | 0.4 | — | 0.4 |
| | Polylysine (molecular weight: 80000) | — | — | — | — | — | — | — | — | — | — | — | — | 0.4 | — |
| Abrasive (wt %) | Colloidal silica | — | — | — | — | — | — | 0.05 | 0.05 | — | — | 0.05 | — | — | — |
| pH | | 2.2 | 2.7 | 2.2 | 2.7 | 2.2 | 2.2 | 2.2 | 2.2 | 3.5 | 3.5 | 2.2 | 2.2 | 2.2 | 2.2 |
| Polishing rate (nm/min) | | 500 | 550 | 600 | 650 | 600 | 600 | 750 | 800 | 550 | 600 | 220 | 130 | 120 | 160 |
| Dishing (nm) | | 75 | 85 | 65 | 70 | 85 | 60 | 95 | 85 | 160 | 140 | 120 | 120 | 150 | 120 |
| Scratches | | none | none | none | none | none | none | none | none | none | none | none | none | none | none |

In Table 1, the polishing liquid (I) having pH 3.5 in Comparative Example 1 shows greater dishing than by the polishing liquid (A) having pH 2.2 in Example 1 or the polishing liquid (B) having pH 2.7 in Example 2. The polishing liquid (J) having pH 3.5 in Comparative Example 2 shows greater dishing than by the polishing liquid (C) having pH 2.2 in Example 3 or the polishing liquid (D) having pH 2.7 in Example 4. The polishing liquid (K) with a water-soluble polymer having a small weight-average molecular weight of 7000 in Comparative Example 3 shows a lower polishing rate and greater dishing than by the polishing liquid (G) with a water-soluble polymer having a large weight-average molecular weight or the polishing liquid (H) in Example (8). The polishing liquid (L) having pH 2.2 without using a water-soluble polymer in Comparative Example 4 shows a lower polishing rate and greater dishing. The polishing liquid (M) using a cationic polymer in Comparative Example 5 shows a lower polishing rate and greater dishing. The polishing liquid (N) with a water-soluble polymer having a small weight-average molecular weight of 7000 in Comparative Example 6 shows a lower polishing rate and greater dishing.

On the other hand, the polishing liquids (A) to (H) in Examples 1 to 8 show a higher polishing rate and smaller dishing.

The invention claimed is:

1. A metal polishing liquid comprising a metal oxidizer, a metal oxide solubilizer, a metal anticorrosive, and a water-soluble polymer having an anionic functional group with a weight-average molecular weight of 8,000 or more,
   wherein the metal oxide solubilizer consists of at least one selected from inorganic or organic acids having a first-stage acid dissociation exponent of less than 3.7 at 25° C. and salts thereof,
   the metal polishing liquid has a pH of 1 to 2.8, and
   the water-soluble polymer has a median size of 20 nm or less, when measured using a laser diffraction particle size distribution meter, in an aqueous solution containing the water-soluble polymer adjusted to the same pH as the metal polishing liquid with the metal oxide solubilizer.

2. The metal polishing liquid according to claim 1, wherein the metal oxidizer is at least one oxidizer selected from hydrogen peroxide, ammonium persulfate, nitric acid, potassium periodate, hypochlorous acid, and ozone water.

3. The metal polishing liquid according to claim 1, wherein the metal oxide solubilizer consists of at least one selected from malonic acid, citric acid, malic acid, glycolic acid, glutamic acid, oxalic acid, tartaric acid, sulfuric acid, nitric acid, phosphoric acid, hydrochloric acid, formic acid and salts thereof.

4. The metal polishing liquid according to claim 1, wherein the metal anticorrosive is at least one metal anticorrosive selected from a nitrogen-containing cyclic compound and an ionic surfactant.

5. The metal polishing liquid according to claim 1, wherein the water-soluble polymer having an anionic functional group is a water-soluble polymer having at least one anionic functional group selected from a sulfonic acid group, a carboxylic acid group, a phosphoric acid group or a salt thereof.

6. The metal polishing liquid according to claim 1, wherein abrasive particles are added in an amount of less than 1 wt % based on the weight of the metal polishing liquid.

7. The metal polishing liquid according to claim 6, wherein the abrasive particles are one or more kinds of abrasive particles selected from silica, alumina, ceria, titania, zirconia and germania.

8. The metal polishing liquid according to claim 1, wherein a metal to be polished, which is capable of being removed by polishing, is at least one metal selected from copper, a copper alloy and a copper compound.

9. A method of polishing a film to be polished comprising removing excess of a metallic film to be polished by using a metal polishing liquid, wherein the metal polishing liquid contains a metal oxidizer, a metal oxide solubilizer, a metal anticorrosive, and a water-soluble polymer having an anionic functional group with a weight-average molecular weight of 8,000 or more, the metal oxide solubilizer consists of at least one selected from inorganic or organic acids having a first-stage acid dissociation exponent of less than 3.7 at 25° C. and salts thereof, the metal polishing liquid has a pH of 1 to 2.8, and the water-soluble polymer has a median size of 20 nm or less, when measured using a laser diffraction particle size distribution meter, in an aqueous solution containing the water-soluble polymer adjusted to the same pH as the metal polishing liquid with the metal oxide solubilizer.

10. The method of polishing a film to be polished according to claim 9, wherein removing the excess of the metallic film to be polished by using the metal polishing liquid includes supplying the metal polishing liquid onto a polishing cloth of a polishing platen and simultaneously relatively moving the polishing platen and a substrate having the metallic film to be polished while the substrate is pressed against the polishing cloth.

11. The method of polishing a film to be polished according to claim 9, wherein removing the excess of the metallic film to be polished by using the metal polishing liquid includes polishing a substrate having an insulating layer, on which a wiring groove is formed, and the metallic film to be polished, which is deposited above the insulating layer on a side of the substrate to be polished.

12. The method of polishing a film to be polished according to claim 9, wherein the metal oxidizer is at least one oxidizer selected from hydrogen peroxide, ammonium persulfate, nitric acid, potassium periodate, hypochlorous acid, and ozone water.

13. The method of polishing a film to be polished according to claim 9, wherein the metal oxide solubilizer consists of at least one selected from malonic acid, citric acid, malic acid, glycolic acid, glutamic acid, oxalic acid, tartaric acid, sulfuric acid, nitric acid, phosphoric acid, hydrochloric acid, formic acid, and salts thereof.

14. The method of polishing a film to be polished according to claim 9, wherein the metal anticorrosive is at least one metal anticorrosive selected from a nitrogen-containing cyclic compound and an ionic surfactant.

15. The method of polishing a film to be polished according to claim 9, wherein the water-soluble polymer having an anionic functional group is a water-soluble polymer having at least one anionic functional group selected from a sulfonic acid group, a carboxylic acid group, a phosphoric acid group or a salt thereof.

16. The method of polishing a film to be polished according to claim 9, wherein abrasive particles are added in an amount of less than 1 wt % based on the weight of the metal polishing liquid.

17. The method of polishing a film to be polished according to claim 16, wherein the abrasive particles are one or more kinds of abrasive particles selected from silica, alumina, ceria, titania, zirconia and germania.

18. The method of polishing a film to be polished according to claim 9, wherein a metal to be polished, which is capable of being removed by polishing, is at least one metal selected from copper, a copper alloy and a copper compound.

19. The method of polishing a film to be polished according to claim 11, wherein a TaN film, a Ta film, and a copper film are formed between the insulating layer and the metallic film to be polished.

* * * * *